United States Patent
Soorapanth et al.

(10) Patent No.: US 6,850,749 B2
(45) Date of Patent: Feb. 1, 2005

(54) LOCAL OSCILLATOR ARCHITECTURE TO REDUCE TRANSMITTER PULLING EFFECT AND MINIMIZE UNWANTED SIDEBAND

(75) Inventors: Chet Soorapanth, Mountain View, CA (US); Behzad Razavi, Los Angeles, CA (US); Pengfei Zhang, Fremont, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 489 days.

(21) Appl. No.: 10/113,846

(22) Filed: Mar. 27, 2002

(65) Prior Publication Data

US 2002/0180538 A1 Dec. 5, 2002

Related U.S. Application Data

(60) Provisional application No. 60/294,715, filed on May 30, 2001.

(51) Int. Cl.[7] .................................................. H04B 1/26
(52) U.S. Cl. ........................ 455/318; 455/259; 455/260; 455/317
(58) Field of Search .............................. 455/313, 317, 455/333, 130, 255, 260, 265, 334, 302, 230, 318, 315; 331/74, 1 R, 2, 51, 105, 88, 175

(56) References Cited

U.S. PATENT DOCUMENTS 5,303,417 A * 4/1994 Laws ........................ 455/314
6,081,697 A * 6/2000 Haartsen ..................... 455/109
6,574,462 B1 * 6/2003 Strange ...................... 455/318
6,757,523 B2 * 6/2004 Fry ............................. 455/78
2002/0058491 A1 * 5/2002 Minnis et al. .............. 455/323
2002/0065060 A1 * 5/2002 Minnis et al. .............. 455/324
2002/0127992 A1 * 9/2002 Fransis ....................... 455/315
2002/0160741 A1 * 10/2002 Kim et al. .................. 455/318
2003/0001782 A1 * 1/2003 Takahashi et al. .......... 343/701

OTHER PUBLICATIONS

Darabi, H. et al., "A 2.4GHz CMOS Transceiver for Bluetooth," 201 IEEE International Solid–State Circuits Conference, Session 13, Wireless LAN, 13.3, pp. 200–201.

Ellis, Mike, "Gilbert Cells," 1999, http://members.tripod.com/michaelgellis/gilbert.html.

* cited by examiner

Primary Examiner—Sonny Trinh
(74) Attorney, Agent, or Firm—Withrow & Terranova, PLLC

(57) ABSTRACT

A local oscillator architecture provides a signal at an output frequency with reduced pulling effect. A voltage controlled oscillator (VCO) generates a first signal having a frequency that is a fraction of the output frequency. A frequency shifter generates a second signal with a frequency substantially equal to the difference between the VCO frequency and the output frequency. Single-sideband mixers are used to produce output signals at the sum of the VCO frequency and the shifted frequency while suppressing an unwanted sideband at the difference of the two frequencies.

23 Claims, 4 Drawing Sheets

LOCAL OSCILLATOR ARCHITECTURE TO REDUCE TRANSMITTER PULLING EFFECT AND MINIMIZE UNWANTED SIDEBAND

CROSS-REFERENCES TO RELATED APPLICATIONS

This application claims priority from U.S. Provisional Application Ser. No. 60/294,715, filed May 30, 2001, the disclosure of which is hereby incorporated by reference in its entirety.

BACKGROUND OF THE INVENTION

The present invention relates generally to oscillator circuits and in particular to a local oscillator architecture that reduces a transmitter pulling effect in a radio-frequency transmitter.

Radio-frequency (RF) transmitters implemented on silicon chips are commonly used in wireless communication systems such as local area networks, cellular phones, and so on. An example of a conventional RF transmitter 100 is shown in FIG. 1. Data received by transmitter 100 are processed in a signal processing system 104, which may include digital-to-analog conversion, filtering, and other processing, resulting in a data signal D. Data signal D is then used by a mixer 106 to modulate a carrier signal having a frequency $f_0$. The carrier signal is generated by a local oscillator 108, which generally includes a voltage controlled oscillator (VCO) 110 operating at the carrier frequency $f_0$. Ideally, local oscillator 108 provides a pure tone at frequency $f_0$ so that all modulations in the output of mixer 106 are due to data signal D. The modulated signal D' is amplified by a power amplifier 112, which typically consumes about 1 watt, and transmitted via antenna 114.

In silicon-chip implementations, transmitter 100 is subject to a pulling effect. The large output current from amplifier 112 can leak through the substrate or through various circuit pathways of the chip. As indicated by the dotted line in FIG. 1, this leakage current can affect the operation of VCO 110, causing the frequency spectrum of VCO 110 to be significantly wider than the ideal pure tone at $f_0$. This pulling effect may result in undesirable frequency components in the transmitted signal, increasing the occurrence of receiver errors. The effect can be reduced to some extent by placing a buffer between local oscillator 108 and mixer 106, but it cannot be eliminated.

A more effective technique is to design the VCO to operate at a different frequency from the carrier frequency $f_0$ and then use a combination of frequency shifter and mixer circuits to shift the frequency back to the carrier frequency $f_0$. This technique, however, results in generation of unwanted sidebands and spurs at the mixer output, which if not addressed would result in undesirable frequency components in the transmitted signal. Bandpass filter circuits may be used to reduce the unwanted sidebands and spurs. However, filter circuits consume silicon area, increasing chip size. Moreover, for high-frequency applications, real bandpass filters are difficult to implement in silicon, due to limitations in the quality of passive components of the filter.

Therefore, an improved local oscillator architecture that reduces the pulling effect and minimizes unwanted sidebands and spurs, would be desirable.

BRIEF SUMMARY OF THE INVENTION

The present invention provides a local oscillator architecture that can reduce the pulling effect and minimize the unwanted sideband. A voltage controlled oscillator (VCO) generates a first signal having a frequency that is a fraction of the output frequency. A frequency shifter generates a second signal with a frequency substantially equal to the difference between the VCO frequency and the output frequency. Single-sideband mixing is then used to produce an output signal at the sum of the VCO frequency and the shifted frequency while suppressing an unwanted sideband at the difference of the two frequencies.

According to one aspect of the invention, a local oscillator is provided for generating signals at an output frequency. The local oscillator includes an oscillatory circuit configured to generate a first in-phase signal and a first quadrature signal at a first frequency lower than the output frequency, the first quadrature signal having a phase shift relative to the first in-phase signal; a frequency shifter coupled to receive at least one of the first in-phase signal and the first quadrature signal and configured to generate a second in-phase signal and a second quadrature signal at a second frequency substantially equal to the difference between the first frequency and the output frequency; and a first single-sideband mixer coupled to receive the first in-phase signal, the first quadrature signal, the second in-phase signal, and the second quadrature signal and configured to generate an output in-phase signal having a frequency substantially equal to the output frequency. A second single-sideband mixer may also be coupled to receive the first in-phase signal, the first quadrature signal, the second in-phase signal, and the second quadrature signal and configured to generate an output quadrature signal having a frequency substantially equal to the output frequency. The single-sideband mixers may be either single-balanced or double-balanced mixers.

In one embodiment, the first frequency is substantially equal to two-thirds of the output frequency, the second frequency is substantially equal to one-third of the output frequency, and the frequency shifter is configured to generate the second in-phase and second quadrature signals by dividing the frequency of one of the first in-phase and first quadrature signals by two. In an alternative embodiment, the first frequency is substantially equal to four-fifths of the output frequency, the second frequency is substantially equal to one-fifth of the output frequency, and the frequency shifter is configured to generate the second in-phase and second quadrature signals by dividing the frequency of one of the first in-phase and first quadrature signals by four.

In one embodiment, the first single-sideband mixer is configured to subtract a product of the first quadrature signal and the second quadrature signal from a product of the first in-phase signal and the second in-phase signal, thereby generating the output in-phase signal, and the second single-sideband mixer is configured to add a product of the first quadrature signal and the second in-phase signal to a product of the second quadrature signal and the first in-phase signal, thereby generating the output quadrature signal.

According to another aspect of the invention, the local oscillator may be used in a radio-frequency transmitter. The transmitter has a mixer configured to modulate the first output signal with a data signal, thereby producing a modulated signal; an amplifier configured to amplify the modulated signal, thereby producing an amplified signal; and a transmit antenna configured to transmit the amplified signal.

According to yet another aspect of the invention, a method for generating an oscillatory signal having a selected frequency is provided. A first in-phase signal and a first quadrature signal are generated, each of the first in-phase signal and the first quadrature signal oscillating at a first frequency equal to a fraction of the selected frequency. One of the first in-phase signal and the first quadrature signal is then frequency-shifted, thereby generating a second in-phase signal and a second quadrature signal, each of the second in-phase signal and the second quadrature signal oscillating at a second frequency substantially equal to a difference between the selected frequency and the first frequency. A product of the first quadrature signal and the second quadrature signal is subtracted from a product of the first in-phase signal and the second in-phase signal, thereby generating a first output signal. In parallel, a product of the first quadrature signal and the second in-phase signal may also be added to a product of the second quadrature signal and the first in-phase signal, thereby generating a second output signal, the second output signal in quadrature with the first output signal. In one embodiment, the first frequency is substantially equal to two-thirds of the selected frequency.

The following detailed description together with the accompanying drawings will provide a better understanding of the nature and advantages of the present invention.

DETAILED DESCRIPTION OF THE INVENTION

A local oscillator in accordance with the present invention provides a signal at an output frequency with reduced pulling effect. As described further below, the local oscillator includes a voltage controlled oscillator (VCO). The VCO generates a first signal having a frequency that is a fraction of the output frequency. A frequency shifter generates a second signal with a frequency substantially equal to the difference between the VCO frequency and the output frequency. Single-sideband mixing of the first and second signals produces an output signal at the sum of the VCO frequency and the shifted frequency while suppressing an unwanted sideband at the difference of the two frequencies.

Figure 1:
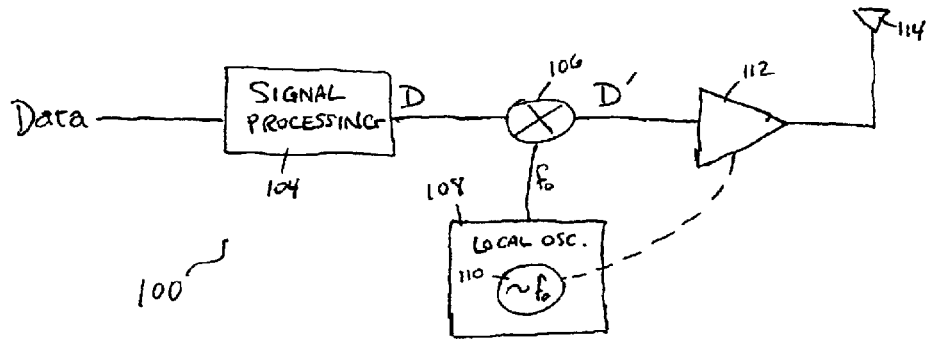
FIG. 1 is a simplified block diagram illustrating a conventional radio-frequency transmitter.
Figure 2:
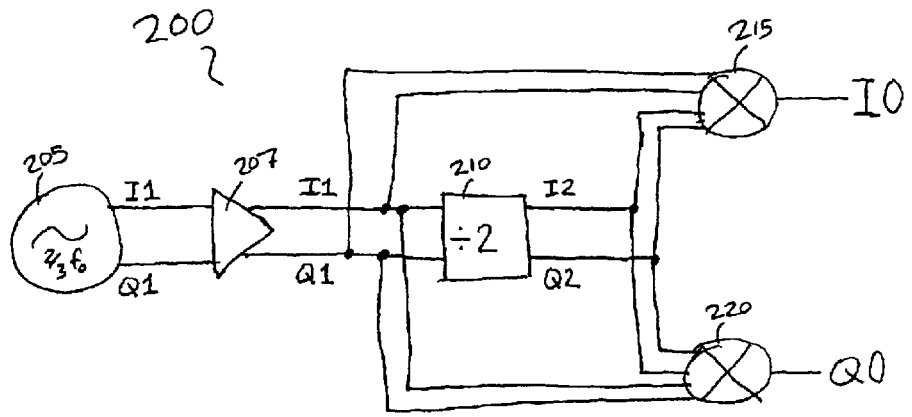
FIG. 2 is a simplified block diagram illustrating a local oscillator architecture according to the present invention.

FIG. 2 is a simplified block diagram illustrating a preferred embodiment of a local oscillator 200 for producing output signals I0 and Q0 having a desired frequency $f_0$. Local oscillator 200 includes a quadrature VCO circuit 205, a buffer 207, a frequency divider 210, and two single-sideband mixers 215, 220. Each of these components will be described in turn.

Quadrature VCO circuit 205 produces a first in-phase signal I1 having a frequency $f_1 = 2/3 * f_0$, and a first quadrature signal Q1 having the same frequency $f_1$. The phase of first quadrature signal Q1 differs from that of first in-phase signal I1 by approximately 90°. For instance, if $\omega_0 = 2\pi f_0$, then I1 and Q1 may be represented, respectively, by:

$$I1 = \cos 2\omega_0 t/3,$$

and $$Q1 = \cos(2\omega_0 t/3 + 90°).$$

A control signal (not shown) may be provided to VCO circuit 205 in order to enable selection of a desired value for frequency $f_1$. Such control signals are known in the art.

Quadrature VCO circuit 205 may be implemented using any suitable circuitry. For instance, a standard VCO may be operated at the frequency $f_1$ to generate a first in-phase signal I1 having a particular phase. First in-phase signal I1 may then be passed through a 90° phase shifter to introduce the desired phase shift, thereby generating first quadrature signal Q1. Alternatively, two linked VCOs may be operated at the frequency $f_1$ to produce first in-phase signal I1 and first quadrature signal Q1 together, without the use of a phase shifter; such circuits are known in the art. It will be appreciated that any VCO circuit capable of generating the VCO output frequency $f_1$ may be used as part of local oscillator 200.

First in-phase and quadrature signals I1, Q1 are provided via buffer 207 to frequency divider circuit 210, which produces a second in-phase signal I2 and a second quadrature signal Q2. Second in-phase signal I2 corresponds to first in-phase signal I1, except that the frequency $f_2$ of second in-phase signal I2 is half that of first in-phase signal I1 (i.e., $f_2 = 0.5 * f_1$). Second quadrature signal Q2 corresponds to second in-phase signal I2 with a phase shift of approximately 90°. For instance, for the I1 and Q1 functions given above, I2 and Q2 are given by:

$$I2 = \cos \omega_0 t/3,$$

and $$Q2 = \cos(\omega_0 t/3 + 90°).$$

In an exemplary embodiment, frequency divider circuit 210 uses only one of the first in-phase and quadrature signals I1, Q1 to generate the second in-phase and quadrature signals I2, Q2; the other one of the first in-phase and quadrature signals I1, Q1 is provided for load balancing purposes. Suitable frequency divider circuits are known in the art and so are not described in detail herein.

Both in-phase signals I1, I2 and both quadrature signals Q1, Q2 are provided to first single-sideband mixer 215 and to second single-sideband mixer 220. First single-sideband mixer 215 generates an in-phase output signal I0 according to the equation:

$$I0 = (I1 * I2) - (Q1 * Q2).$$

One skilled in the art will appreciate that for the functions for the signals I1, I2, Q1, and Q2 given above, it follows that $I0 = \cos \omega_0 t$. Thus, I0 is an in-phase signal with a frequency equal to the desired output frequency $f_0$.

Similarly, second single-sideband mixer 220 generates a quadrature output signal Q0 according to the equation:

$$Q0 = (Q1 * I2 + I1 * Q2).$$

One skilled in the art will appreciate that for the functions for the signals I1, I2, Q1, and Q2 given above, it follows that $Q0 = \cos(\omega_0 t + 90°)$. Thus, Q0 has a frequency equal to the desired output frequency $f_0$ and a 90-degree phase shift relative to I0.

Figure 3A:
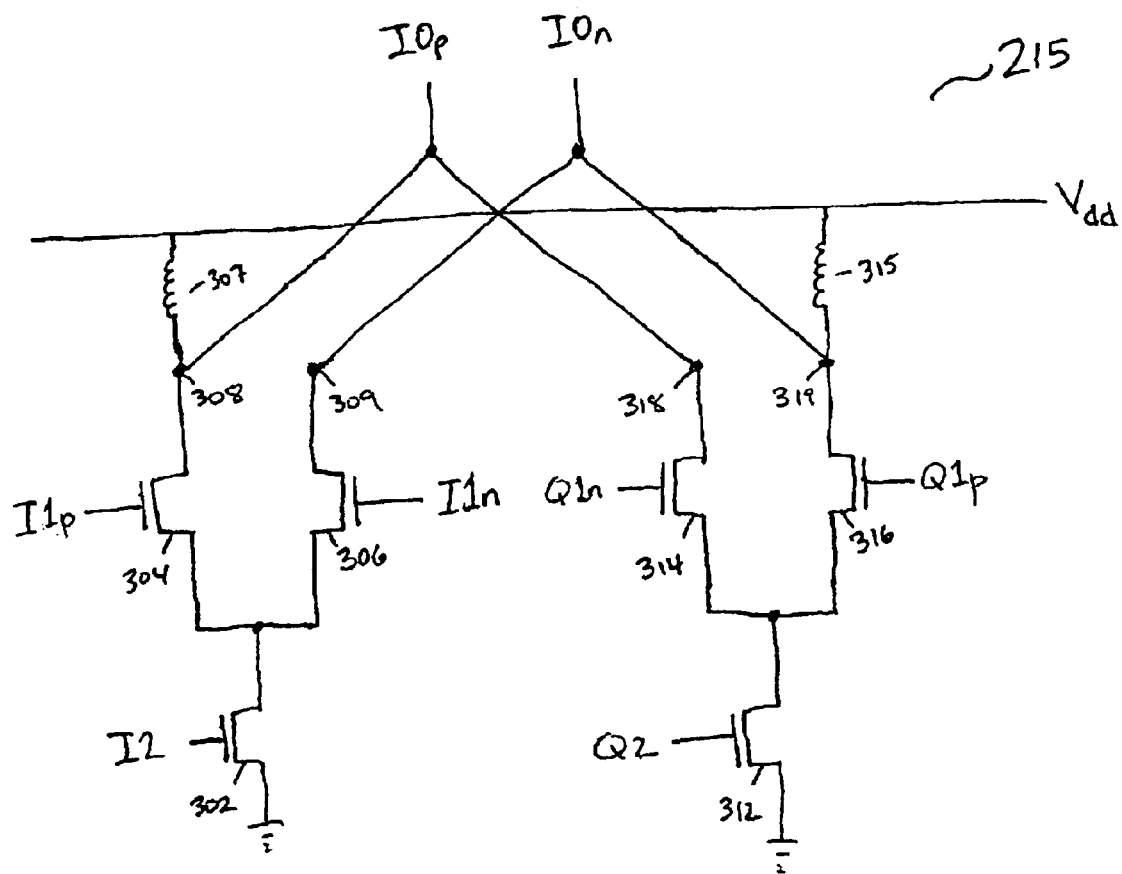
FIGS. 3A–B are schematic diagrams of single-sideband mixers for use in a local oscillator according to the present invention.
Figure 3B:
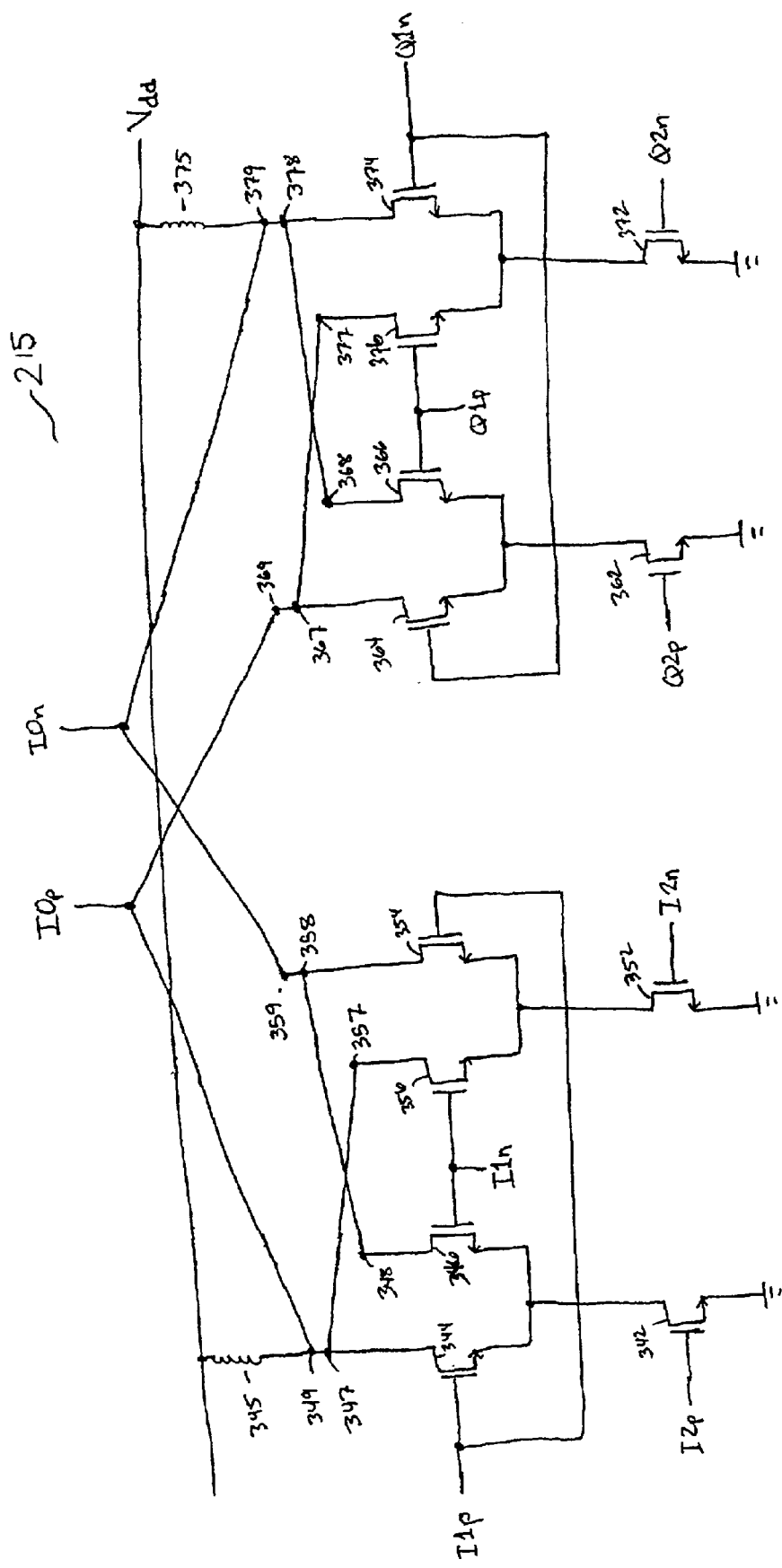

Single-sideband mixers 215, 220 may be implemented using mixer circuits known in the art. For example, FIGS. 3A and 3B illustrate, respectively, a single-balanced and a double-balanced mixer 215 adapted to generate in-phase output signal I0. In these implementations, the signals I1, Q1, I2, Q2, and I0, Q0, may be carried as differential signals on pairs of lines designated I1p (for positive), I1n (for negative), and so on.

FIG. 3A illustrates a single-balanced implementation of single-sideband mixer 215. The second in-phase signal I2 drives the gate of transistor 302. The differential signals I1p, I1n drive the gates of transistors 304, 306, respectively. Each of transistors 304 and 306 has its source coupled to the drain of transistor 302 and its drain coupled through a load element 307 or 315 (which may include, e.g., an inductor or a resistor) to a power supply voltage $V_{dd}$. As is known, output signals that appear at nodes 308 and 309 each include four frequency components: $f_1; f_2; f_0$ (i.e., the desired sideband at $f_1+f_2$); and an unwanted sideband at $f_1-f_2$. (Due to nonlinearity in the mixer, components at other frequencies may also be present at lower levels.) Similarly, the second quadrature signal Q2 drives the gate of transistor 312. The differential signals Q1n, Q1p drive the gates of transistors 314, 316, respectively. Each of transistors 314 and 316 has its source coupled to the drain of transistor 312 and its drain coupled through a load element 307 or 315 to the power supply voltage $V_{dd}$. Output signals that appear at nodes 318 and 319 each include the four frequency components $f_1$, $f_2$, $f_0$, and $f_1-f_2$.

To remove the unwanted sideband at $f_1-f_2$, the output signal I0 of mixer 215 is generated by combining signals from nodes 308 and 318 on the positive line I0p and combining signals from nodes 309 and 319 on the negative line I0n. The differential output lines I0p, I0n provide for removal of the unwanted component at the frequency $f_2$, for instance, by using a difference amplifier. The component at frequency $f_1$, however, is not eliminated by the mixer 215, although it may be removed by a suitable bandpass filter. For example, where inductors are used as the load elements 307, 315 in mixer 215, the inductors resonate with a parasitic capacitance at the output nodes, thereby providing second-order bandpass filtering. It will be appreciated that such filtering is capable of reducing spurious signals that are not close to the desired signal.

FIG. 3B illustrates a double-balanced implementation of single-sideband mixer 215, in which the unwanted component at frequency $f_1$ is also removed. Transistors 342, 344, and 346 operate similarly to transistors 302, 304, and 306 of FIG. 3A, producing signals at output nodes 347 and 348 that include frequency components at $f_1, f_2, f_0$, and $f_1-f_2$. Likewise, transistors 372, 374, and 376 operate similarly to transistors 312, 314, and 316 of FIG. 3A, producing signals at output nodes 377 and 378 that include frequency components at $f_1, f_2, f_0$, and $f_1-f_2$.

To remove the unwanted component at frequency $f_1$, additional signals are introduced. Specifically, the negative line of second in-phase signal I2n drives the gate of transistor 352. The differential signals I1p, I1n drive the gates of transistors 354, 356, respectively. Each of transistors 354 and 356 has its source coupled to the drain of transistor 352 and its drain coupled through a load element 375 or 345 to the power supply voltage $V_{dd}$. Thus, signals appearing at nodes 357 and 358 also include frequency components at $f_1, f_2, f_0$, and $f_1-f_2$. The phases of the various components, however, differ from those of the signals at nodes 347 and 348 such that at node 349, the combined signal from nodes 347 and 357 has no component at frequency $f_1$. Likewise, at node 359, the combined signal from nodes 348 and 358 has no component at frequency $f_1$. A similar cancellation function is performed for the quadrature signal component using transistors 362, 364, and 366, resulting in signals at nodes 369 and 379 that have no component at frequency $f_1$. As in the mixer of FIG. 3A, combining the signals from nodes 349 and 369 (and combining the signals from nodes 359 and 379) eliminates the unwanted sideband at frequency $f_1-f_2$. The differential output lines I0p and I0n enable removal of the component at frequency $f_2$, leaving only the desired sideband at frequency $f = f_1+f_2$. It will be appreciated that, if inductors are used as load elements 345, 375, the mixer circuit provides second-order bandpass filtering to further reduce spurious signals.

One skilled in the art will recognize that the mixers shown in FIGS. 3A and 3B may be employed (with straightforward modifications) to generate the quadrature output signal Q0. It will also be appreciated that the mixers described herein are illustrative and that other single-sideband mixers may be substituted.

Further, it will be appreciated that local oscillator 200 as described herein is illustrative, and that modifications and variations are possible. For example, the VCO circuit 205 may be operated at a frequency $f_1$ other than $2/3*f_0$ if a different component is substituted for frequency divider 210. In one such alternative embodiment, VCO circuit 205 is operated at a frequency $f_1=4/5*f_0$, and a frequency divider that divides the input frequency by 4 is substituted for frequency divider 210. In this embodiment, second in-phase and quadrature signals I2, Q2 each have frequency $f_2=1/5*f_0$. One skilled in the art will recognize that single-sideband mixing using mixers 215, 220 produces the desired frequency $f_0$, with other frequency components suppressed. More generally, VCO circuit 205 may be operated to generate signals at a frequency $f_1 = p*f_0$ for $0<p<1$, in conjunction with a frequency shifting circuit configured to generate a complementary frequency $f_2=(1-p)*f_0$. As long as complementary frequencies are provided, single-sideband mixers 215, 220 will generate the desired output frequency $f_0$ and suppress the unwanted sideband at frequency $|f_1-f_2|$. When local oscillator 200 is employed in a radio-frequency transmitter, the choice of $f_1=2/3*f_0$ provides good reduction of the pulling effect; this choice also has the advantage that a divide-by-two frequency shifting circuit is relatively inexpensive to implement.

Figure 4:
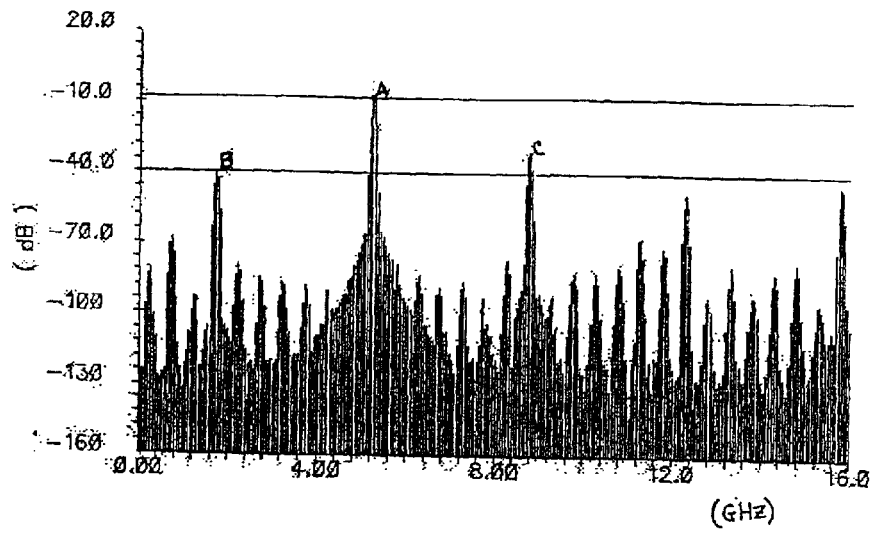
FIG. 4 is a graph illustrating the frequency spectrum produced by a simulated local oscillator according to the present invention.

FIG. 4 is a graph illustrating the performance of a simulation of local oscillator 200 (with double-balanced single-sideband mixing) operating at an output frequency $f_0$ of 5.25 GHz. The signal level (in dB) is shown as a function of frequency (in GHz). As shown, local oscillator 200 produces a signal having a frequency substantially equal to 5.25 GHz (point A). Due to the nonlinear nature of the single-sideband mixers, other frequency components are present, but at significantly suppressed levels. The sideband at $1/3*f_0$ (point B) is suppressed by about 32 dB relative to the signal at $f_0$. A spur at $5/3*f_0$ (point C) is also present due to harmonic effects in the single-sideband mixers, but this spur is significantly suppressed relative to point A. Other spurs due to harmonic effects are also present at even lower levels. If desired, a bandpass filter may be used to remove or further suppress these spurs (e.g., inductors may be used as the mixer load elements as described above). In many applications, I0 and Q0 signals are used to drive a buffer that also provides some degree of bandpass filtering.

Figure 5:
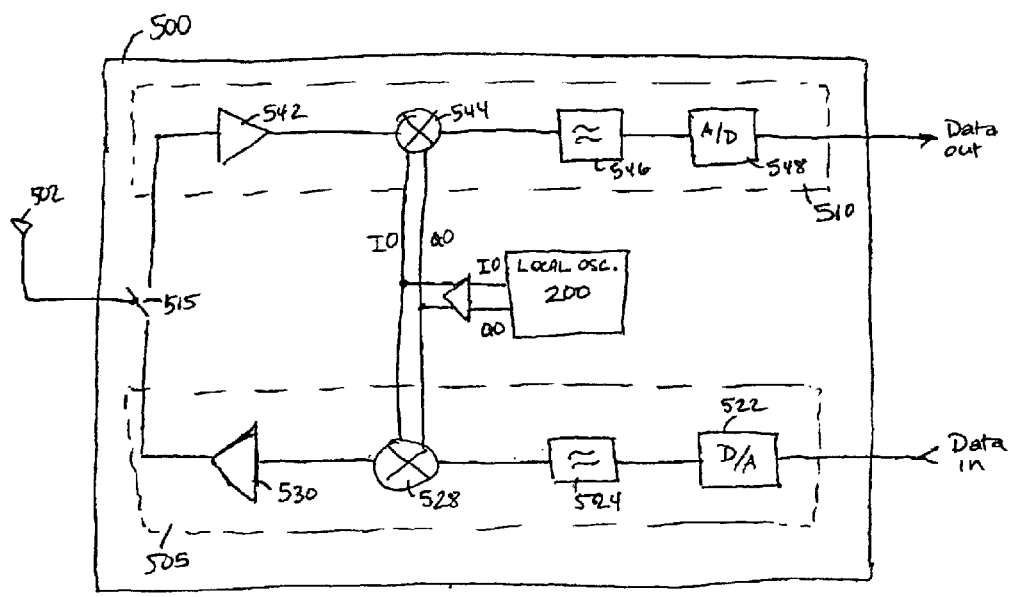
FIG. 5 is a simplified block diagram illustrating a radio-frequency transceiver employing a local oscillator according to the present invention.

FIG. 5 illustrates an application of local oscillator 200 in a direct conversion radio-frequency transceiver 500. Transceiver 500 includes an antenna 502 that may be coupled to either a transmit chain 505 or a receive chain 510 by operation of switch 515. Transmit chain 505 receives digital data, which is converted to an analog signal by digital-toanalog converter 522. Filtering operations are performed by filter 524 to provide a data signal D for transmission. Local oscillator 200 provides I0 and Q0 output signals via a buffer 526 to a mixer 528. Mixer 528 modulates the I0 and Q0 signals with the data signal D received from filter 524. The data signal D' from mixer 528 is amplified by power amplifier 530 and transmitted via antenna 502 when switch 515 is operated to enable transmission. Because amplifier 530 is operating at a frequency $f_0$ (modulated by the data signal D), while the VCO included in local oscillator 200 is operating at a frequency $2/3*f_0$, the VCO is not significantly pulled by the modulated signal D'. Thus, local oscillator 200 provides a reduced transmitter pulling effect. Moreover, in local oscillator 200, the unwanted sideband at $1/3*f_0$ is suppressed without the need for bandpass filtering.

Receiver chain 510 also employs local oscillator 200. Receiver chain 510 includes an amplifier 542 that receives signals from antenna 502 when switch 515 is operated to enable reception. Local oscillator 200 provides I0 and Q0 signals via buffer 526 to a mixer 544. Mixer 544 produces a signal at an intermediate frequency, which is processed by downstream components, including filter 546 and analog-to-digital converter 548.

It will be appreciated that transceiver 500 illustrates just one possible application of local oscillator 200; local oscillator 200 may also be employed in other radio-frequency devices, or in any circuit in which an oscillator operating at essentially a pure frequency is desired.

While the invention has been described with respect to specific embodiments, one skilled in the art will recognize that numerous modifications are possible. For instance, any voltage controlled oscillator circuit may be used, with or without an adjustable control signal. As noted above, the VCO may be operated at any frequency when a corresponding complementary frequency generator is provided. In addition, one skilled in the art will recognize that other oscillatory circuits operating at the frequency $f_1$ may be substituted for the VCO circuit described herein.

It will also be appreciated that any single-sideband mixer may be substituted for the mixer circuits described herein. Further, in an alternative embodiment, only one single-sideband mixer is used to generate a first output signal; if a quadrature output signal is desired, it may be generated from the first output signal by using a phase shifter. It should also be noted that the phase shift between the in-phase and quadrature signals may be varied from 90°, as is known in the art.

Thus, although the invention has been described with respect to specific embodiments, it will be appreciated that the invention is intended to cover all modifications and equivalents within the scope of the following claims.

What is claimed is:

1. A local oscillator for generating signals at an output frequency, the local oscillator comprising:
    an oscillatory circuit configured to generate a first in-phase signal and a first quadrature signal, each of the first in-phase signal and the first quadrature signal having a first frequency lower than the output frequency, the first quadrature signal having a phase shift relative to the first in-phase signal;
    a frequency shifter coupled to receive at least one of the first in-phase signal and the first quadrature signal and configured to generate a second in-phase signal and a second quadrature signal, each of the second in-phase signal and the second quadrature signal having a second frequency substantially equal to the difference between the first frequency and the output frequency; and
    a first single-sideband mixer coupled to receive the first in-phase signal, the first quadrature signal, the second in-phase signal, and the second quadrature signal and configured to generate an output in-phase signal having a frequency substantially equal to the output frequency.

2. The local oscillator of claim 1, further comprising:
    a second single-sideband mixer coupled to receive the first in-phase signal, the first quadrature signal, the second in-phase signal, and the second quadrature signal and configured to generate an output quadrature signal having a frequency substantially equal to the output frequency.

3. The local oscillator of claim 1, wherein the first frequency is substantially equal to two-thirds of the output frequency; and the second frequency is substantially equal to one-third of the output frequency.

4. The local oscillator of claim 1, wherein the first frequency is substantially equal to four-fifths of the output frequency, and the second frequency is substantially equal to one-fifth of the output frequency.

5. The local oscillator of claim 1, wherein the first single-sideband mixer is a double-balanced mixer.

6. The local oscillator of claim 1, wherein the first single-sideband mixer is a single-balanced mixer.

7. A local oscillator for generating signals at an output frequency, the local oscillator comprising:
    a voltage controlled oscillator circuit configured to generate a first in-phase signal and a first quadrature signal, each of the first in-phase and first quadrature signals having a frequency substantially equal to two-thirds of the output frequency;
    a frequency divider configured to receive the first in-phase signal and the first quadrature signal and to generate a second in-phase signal and a second quadrature signal, each of the second in-phase and second quadrature signals having a frequency substantially equal to one-third of the output frequency; and
    a first single-sideband mixer configured to receive the first in-phase signal, the first quadrature signal, the second in-phase signal, and the second quadrature signal and to generate an output in-phase signal having a frequency substantially equal to the output frequency.

8. The local oscillator of claim 7, wherein the first single-sideband mixer is configured to subtract a product of the first quadrature signal times the second quadrature signal from a product of the first in-phase signal times the second in-phase signal, thereby generating the output in-phase signal.

9. The local oscillator of claim 7, further comprising:
    a second single-sideband mixer configured to receive the first in-phase signal, the first quadrature signal, the second in-phase signal, and the second quadrature signal and to generate an output quadrature signal having a frequency substantially equal to the output frequency.

10. The local oscillator of claim 9, wherein the second single-sideband mixer is configured to add a product of the first quadrature signal times the second in-phase signal to a product of the second quadrature signal times the first in-phase signal, thereby generating the output quadrature signal.

11. The local oscillator of claim 7, wherein the first single-sideband mixer is a double-balanced mixer.

12. The local oscillator of claim 7, wherein the first single-sideband mixer is a single-balanced mixer.

13. The local oscillator of claim 7, further comprising a buffer driven by the first in-phase and the first quadrature signals, wherein the buffer provides the first in-phase and the first quadrature signals to the frequency divider.

14. The local oscillator of claim 7, wherein the voltage controlled oscillator circuit comprises:
   a voltage controlled oscillator generating the first in-phase signal; and
   a phase shifter configured to receive the first in-phase signal and to shift a phase of the first in-phase signal, thereby producing the first quadrature signal.

15. The local oscillator of claim 7, wherein the voltage controlled oscillator circuit comprises two linked voltage controlled oscillators for generating the first in-phase signal and the first quadrature signal.

16. A radio-frequency transmitter comprising:
   a data preprocessing unit for receiving data to be transmitted and providing a data signal;
   a local oscillator comprising:
      a voltage controlled oscillator circuit configured to generate a first in-phase signal and a first quadrature signal, each of the first in-phase signal and the first quadrature signal having a first frequency lower than a carrier frequency of the radio-frequency transmitter;
      a frequency shifter configured to receive at least one of the first in-phase signal and the first quadrature signal and to generate a second in-phase signal and a second quadrature signal, each of the second in-phase signal and the second quadrature signal having a second frequency substantially equal to the difference between the first frequency and the carrier frequency; and
      a first single-sideband mixer configured to receive the first in-phase signal, the first quadrature signal, the second in-phase signal, and the second quadrature signal and to generate a first output signal having a frequency substantially equal to the carrier frequency;
   a mixer configured to modulate the first output signal with the data signal, thereby producing a modulated signal;
   an amplifier configured to amplify the modulated signal, thereby producing an amplified signal, and
   a transmit antenna configured to transmit the amplified signal.

17. The radio-frequency transmitter of claim 16, wherein the local oscillator further comprises:
   a second single-sideband mixer configured to receive the first in-phase signal, the first quadrature signal, the second in-phase signal, and the second quadrature signal and to generate an output quadrature signal having a frequency substantially equal to the output frequency.

18. The radio-frequency transmitter of claim 16, wherein the first frequency is substantially equal to two-thirds of the carrier frequency and the second frequency is substantially equal to one-third of the carrier frequency.

19. The radio-frequency transmitter of claim 16, wherein the first frequency is substantially equal to four-fifths of the carrier frequency and the second frequency is substantially equal to one-fifth of the carrier frequency.

20. A method for generating an oscillatory signal having a selected frequency, the method comprising:
   generating a first in-phase signal and a first quadrature signal, each of the first in-phase signal and the first quadrature signal oscillating at a first frequency equal to a fraction of the selected frequency;
   frequency shifting one of the first in-phase signal and the first quadrature signal, thereby generating a second in-phase signal and a second quadrature signal, each of the second in-phase signal and the second quadrature signal oscillating at a second frequency substantially equal to a difference between the selected frequency and the first frequency; and
   subtracting a product of the first quadrature signal times the second quadrature signal from a product of the first in-phase signal times the second in-phase signal, thereby generating a first output signal.

21. The method of claim 20, further comprising:
   adding a product of the first quadrature signal times the second in-phase signal to a product of the second quadrature signal times the first in-phase signal, thereby generating a second output signal, the second output signal in quadrature with the first output signal.

22. The method of claim 20, wherein the first frequency is substantially equal to two-thirds of the selected frequency.

23. The method of claim 20, wherein the first frequency is substantially equal to four-fifths of the selected frequency.

* * * * *